United States Patent
Leijten-Nowak

(10) Patent No.: US 7,183,796 B2
(45) Date of Patent: Feb. 27, 2007

(54) CONFIGURATION MEMORY IMPLEMENTATION FOR LUT-BASED RECONFIGURABLE LOGIC ARCHITECTURES

(75) Inventor: Katarzyna Leijten-Nowak, Eindhoven (NL)

(73) Assignee: NXP BV., Eindhoven (NL)

( * ) Notice: Subject to any disclaimer, the term of this patent is extended or adjusted under 35 U.S.C. 154(b) by 99 days.

(21) Appl. No.: 10/507,813

(22) PCT Filed: Mar. 17, 2003

(86) PCT No.: PCT/IB03/00959

§ 371 (c)(1),
(2), (4) Date: Sep. 14, 2004

(87) PCT Pub. No.: WO03/079549

PCT Pub. Date: Sep. 25, 2003

(65) Prior Publication Data

US 2005/0122132 A1 Jun. 9, 2005

(30) Foreign Application Priority Data

Mar. 18, 2002 (EP) .................................. 02076048

(51) Int. Cl.
*H03K 19/173* (2006.01)
*H03K 19/177* (2006.01)
*G06F 7/38* (2006.01)
*H01L 25/00* (2006.01)

(52) U.S. Cl. ............................ 326/38; 326/37; 326/38; 326/39; 326/40; 326/41; 326/47; 716/16

(58) Field of Classification Search ............ 326/37–41, 326/47; 716/16
See application file for complete search history.

(56) References Cited

U.S. PATENT DOCUMENTS

| | | | |
|---|---|---|---|
| 5,352,940 A * | 10/1994 | Watson | 326/44 |
| 5,442,306 A | 8/1995 | Woo | 326/39 |
| 5,705,938 A * | 1/1998 | Kean | 326/39 |
| 5,742,180 A | 4/1998 | DeHon et al. | 326/40 |
| 6,034,542 A * | 3/2000 | Ridgeway | 326/39 |
| 6,288,568 B1 * | 9/2001 | Bauer et al. | 326/39 |
| 6,501,296 B2 * | 12/2002 | Wittig et al. | 326/39 |
| 6,621,296 B2 * | 9/2003 | Carberry et al. | 326/40 |
| 6,768,338 B1 * | 7/2004 | Young et al. | 326/44 |

FOREIGN PATENT DOCUMENTS

EP 0790706 8/1997

* cited by examiner

*Primary Examiner*—Rexford Barnie
*Assistant Examiner*—Dylan White
(74) *Attorney, Agent, or Firm*—Kevin H. Fortin

(57) ABSTRACT

A reconfigurable processing unit (1) is described which comprises, data flow controlling elements (10), data manipulating elements (20), a configuration memory unit (30) comprising a plurality of memory cells (31a, . . . ) for storing settings of the data flow controlling elements (10) and an address decoder (40) for converting an address into selection signals for the memory cells (31a, . . . ). The reconfigurable processing unit of the invention is characterized in that the address decoder (40) is shared between the configuration memory unit (30) and a further memory unit (20), or between two configuration memory units (30, 30'). This provides for a reduction in memory area of the reconfigurable processing unit (1).

4 Claims, 7 Drawing Sheets

Figure 1:
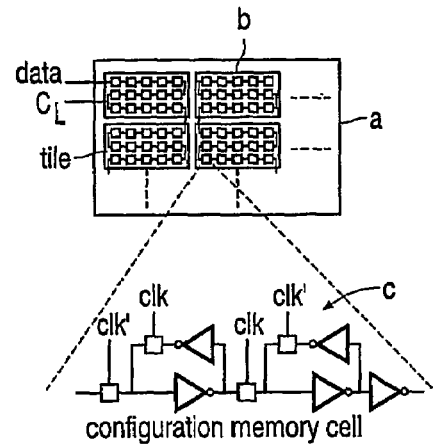

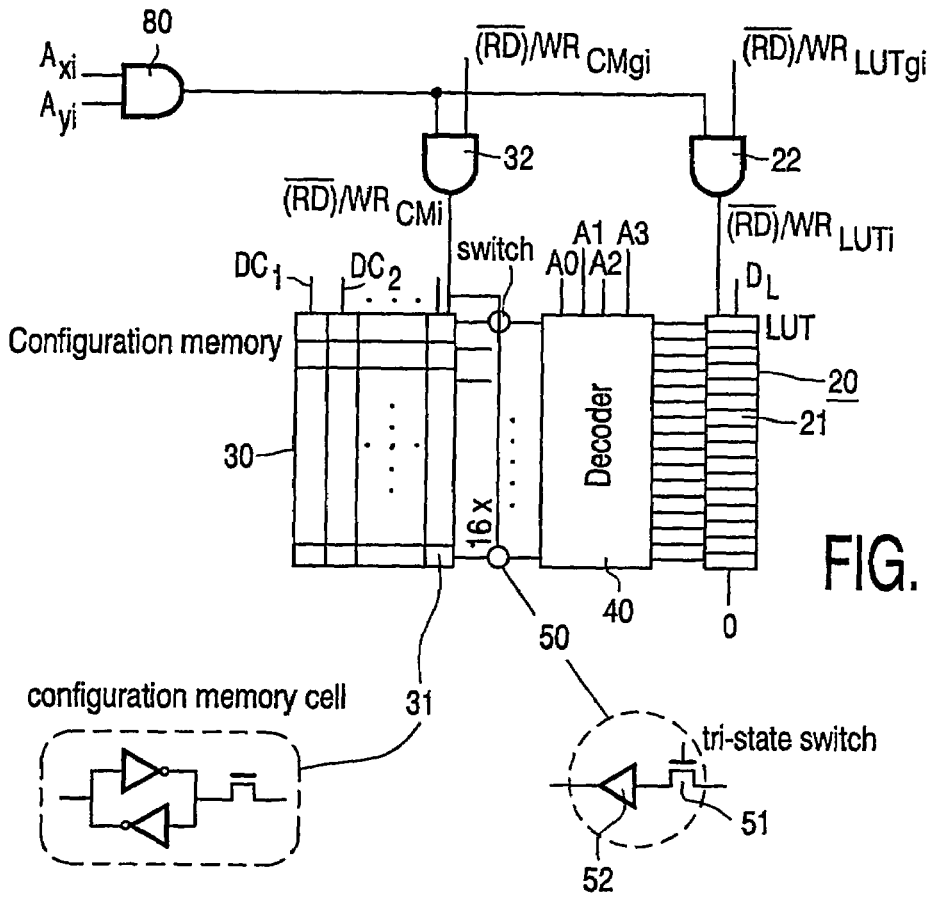
FIG. 7
FIG. 7A
FIG. 7B
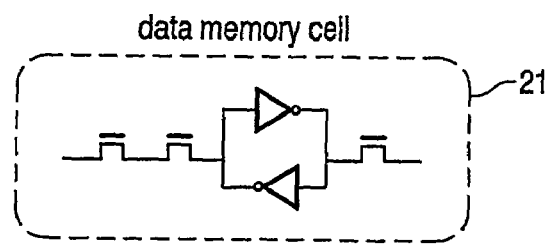
FIG. 7C

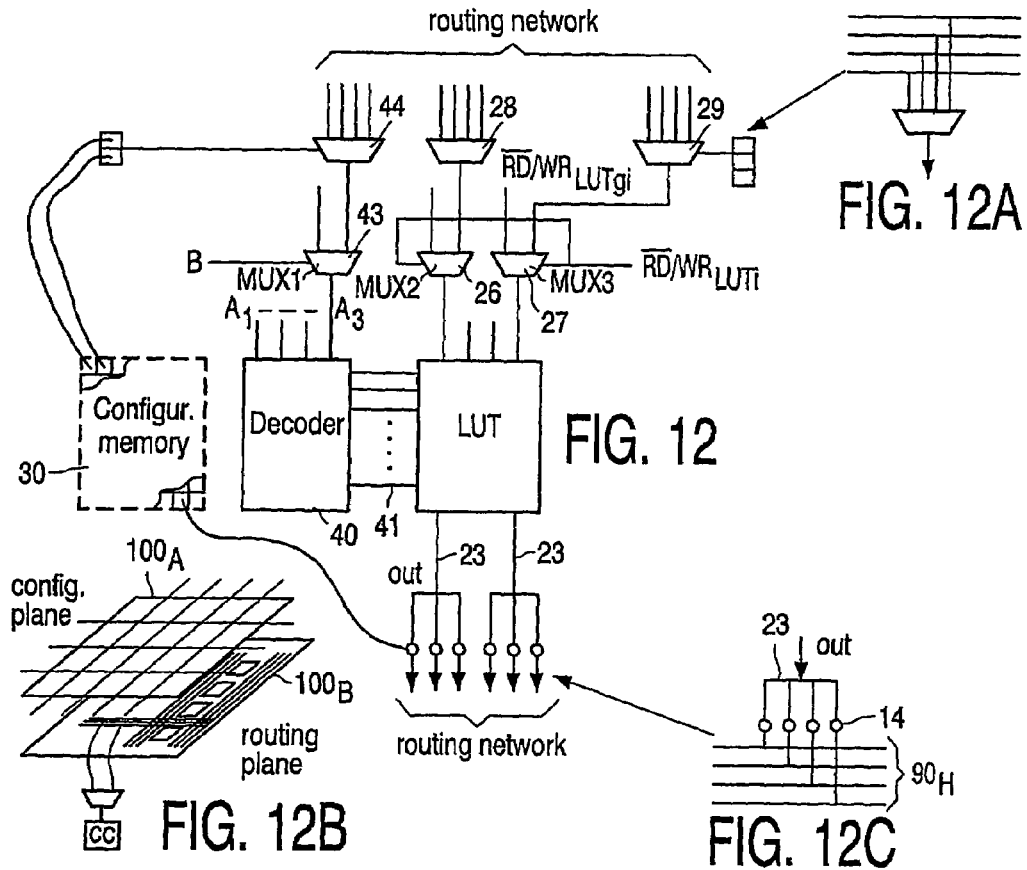
FIG. 12A
FIG. 12
FIG. 12B
FIG. 12C
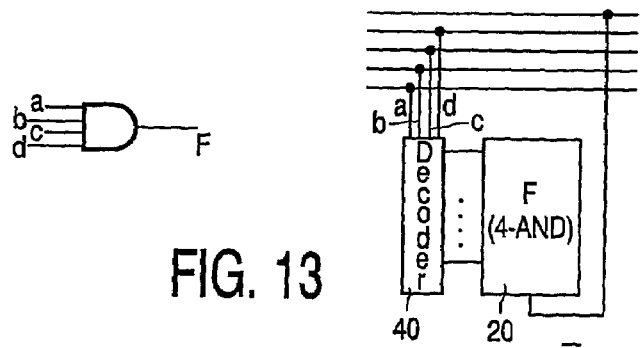
FIG. 13
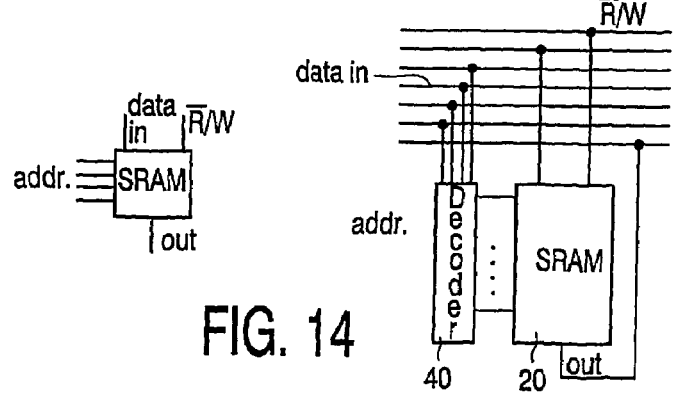
FIG. 14

CONFIGURATION MEMORY IMPLEMENTATION FOR LUT-BASED RECONFIGURABLE LOGIC ARCHITECTURES

This application is a 371 national stage application of PCT/EP03/12747 filed on Nov. 14, 2003 of German application 102 55 658.7 filed on Nov. 28, 2002.

The present invention relates to a reconfigurable processing unit according to the introductory portion of claim 1. Reconfigurable logic devices comprise data flow controlling elements such as multiplexers, demultiplexers, gates etc and datamanipulating elements, such as logic gates, adders and lookup tables, or elements which can be configured as such. The latter allow implementation of various functions, which can be redefined easily by loading them with a different configuration content. Reconfigurable logic devices further comprise configuration memory units (configuration memory) for storing settings of data flow controlling elements, such as multiplexers, demultiplexers, switches etc. In this way connections between different parts of the reconfigurable processing unit can be rapidly redefined. Selection signals for the memory cells are generated by an addres decoderin response to an address offered at the input thereof.

In reconfigurable logic (RL) devices, such as FPGAs for example, functionality of the basic computational blocks (logic cells) as well as connections between them are programmable by an end-user.

Usually the reconfigurable processing units form tiles in a reconfigurable processing device. A tile is defined as a logic cell with associated routing resources. The use of RL devices enables a rapid and flexible prototyping of new hardware designs. In particular RL devices allow a user the implementation of functions which were not even known at the time that RL device was designed.

The price for such flexibility is a considerable area and performance overhead in comparison with ASICs. This is mainly due to a large number of configuration memory bits which are required to control logic and routing resources, and due to a large amount of programmable interconnects.

Since the configuration memory plays only a supportive role with respect to other reconfigurable device resources, the area it takes should be minimised. A straightforward way do so is to reduce the number of programmable switches, and thus the number of memory bits associated with them. Since this influences directly the routing flexibility of a device, such a solution is usually unacceptable. A second method is to implement a configuration memory in such a way that it leads to the least overhead. Commercial devices as well as implementations known from the literature show that this is far from trivial. Due to the architectural and physical implementation constraints in the majority of RL devices the configuration memory still occupies a considerable amount of the total device area. This forms even a greater problem in embedded devices for which partial and dynamic reconfiguration are often the key features. Hardware resources to implement such features usually increase the area overhead even more. Thus, the implementation of the configurable memory in reconfigurable logic devices is an important issue and it strongly influences the quality of the final device.

It is a purpose of the invention to provide a reconfigurable logic device in which the reconfiguration circuitry requires less area. According to the invention this is realized by the characterizing portion of claim 1. In the device according to the invention the configuration circuitry reuses already existing RL device resources, in this way achieving an area reduction The common decoder can for example be shared between two configuration memory units. In such an embodiment, the configuration memory units can be loaded in two phases during a configuration mode. First the decoder adresses a first of the configuration memory units and subsequently it adresses a second of the configuration units. It has the advantage that the area required is reduced, as one decoder suffices for the two memory units. Alternatively both configuration memories coupled to the shared decoder may be addressed and configured at the same time, provided that enough connection pins are available for receiving the configuration data, and that the configuration data bus is wide enough.

In the embodiment of claim 2 the common decoder is shared between a configuration memory unit and a further memory unit which is used for data manipulation. This has the advantage that a decoder already existing for adressing the LUT memory is efficiently used also for adressing the configuration memory.

During a first configuration mode the address decoder is used to address the further memory units so as to load these with LUT-data, the memory units being in a write enable mode. During a second configuration mode, the address decoder is used to address the configuration memory, which is set in a write enable state, and the configuration is written therein. Instead of a first and a second configuration mode the reconfigurable device of the invention could have a single configuration mode, in which the further and configuration memory units are addressed simultaneously with the decoder and loaded with respective data. This has the advantage of a shorter load time. On the other hand the embodiment with separate configuration modes allows a narrower configuration databus.

During an operational mode of the device, the configuration memory is continually kept read-enabled, so that it is capable to control the data flow controlling elements. The further memory units may be kept in a read-enabled state, so that they operate as LUTables. In an embodiment the further memory units are in addition at least partly capable of storing data values being generated as a result of the data flow. This provides for the additional flexibility to use the further memory units either as temporary storage space for storing data already generated in the calculation process or as LUTs for generating new data.

An embodiment is characterized in that the configuration memory units are addressed by the common address decoder via a programmable switch. During the (second) configuration mode the switches are in a conductive state, so that the configuration memory units are coupled to the address decoder, and the configuration memory can be addressed and loaded with configuration data. During the operational mode the switches are in a non-conductive state, so that the address lines of the configuration memory do not load the outputs of the decoder. This improves the quality of the address signals to the further memory units and therewith the speed of the RL device.

Claim 4 describes a practical embodiment of the device according to the invention. In this embodiment the complexity of the local decoders can be relatively simple.

Figure 3:
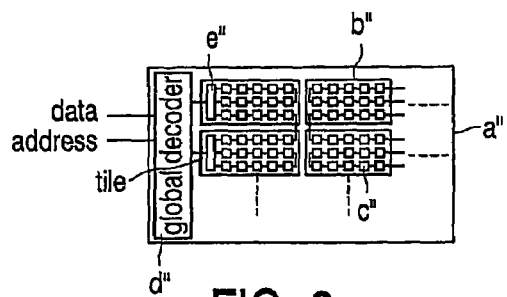
Figure 4:
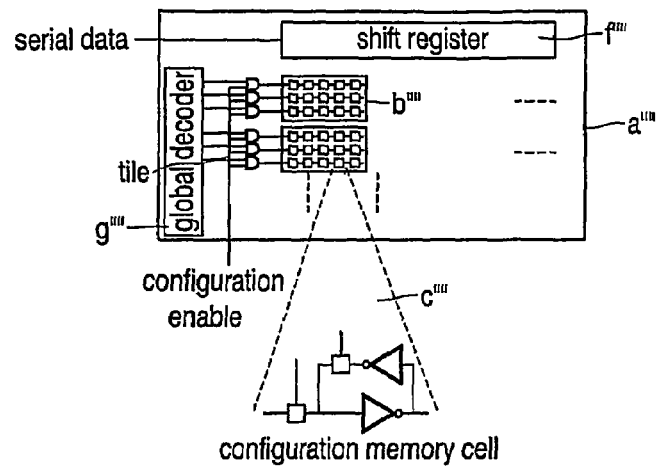
Figures 5A, 5B:
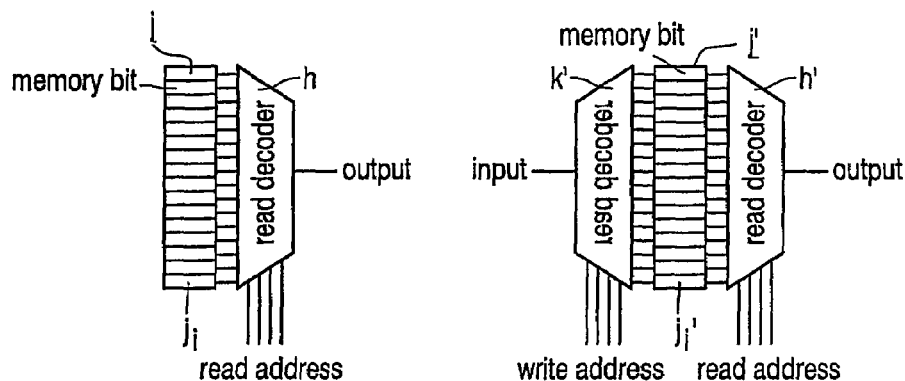
Figure 6:
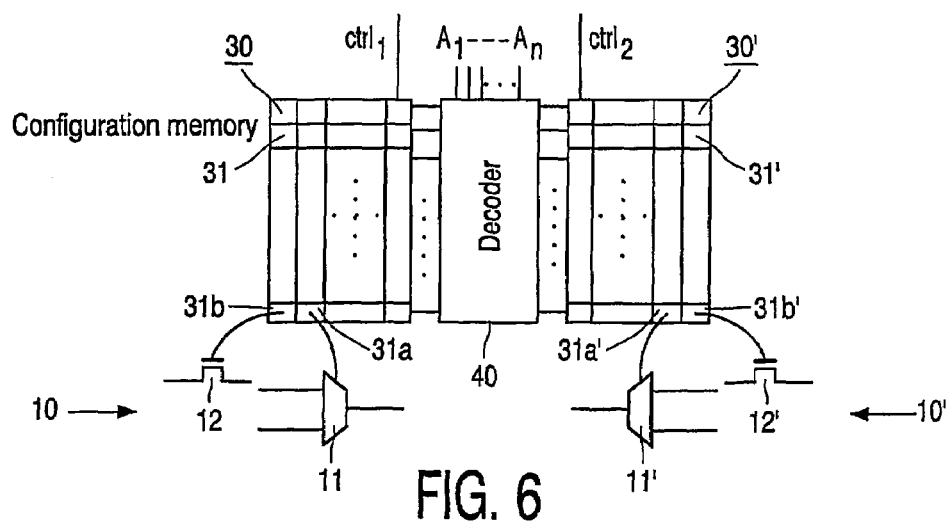
Figure 8:
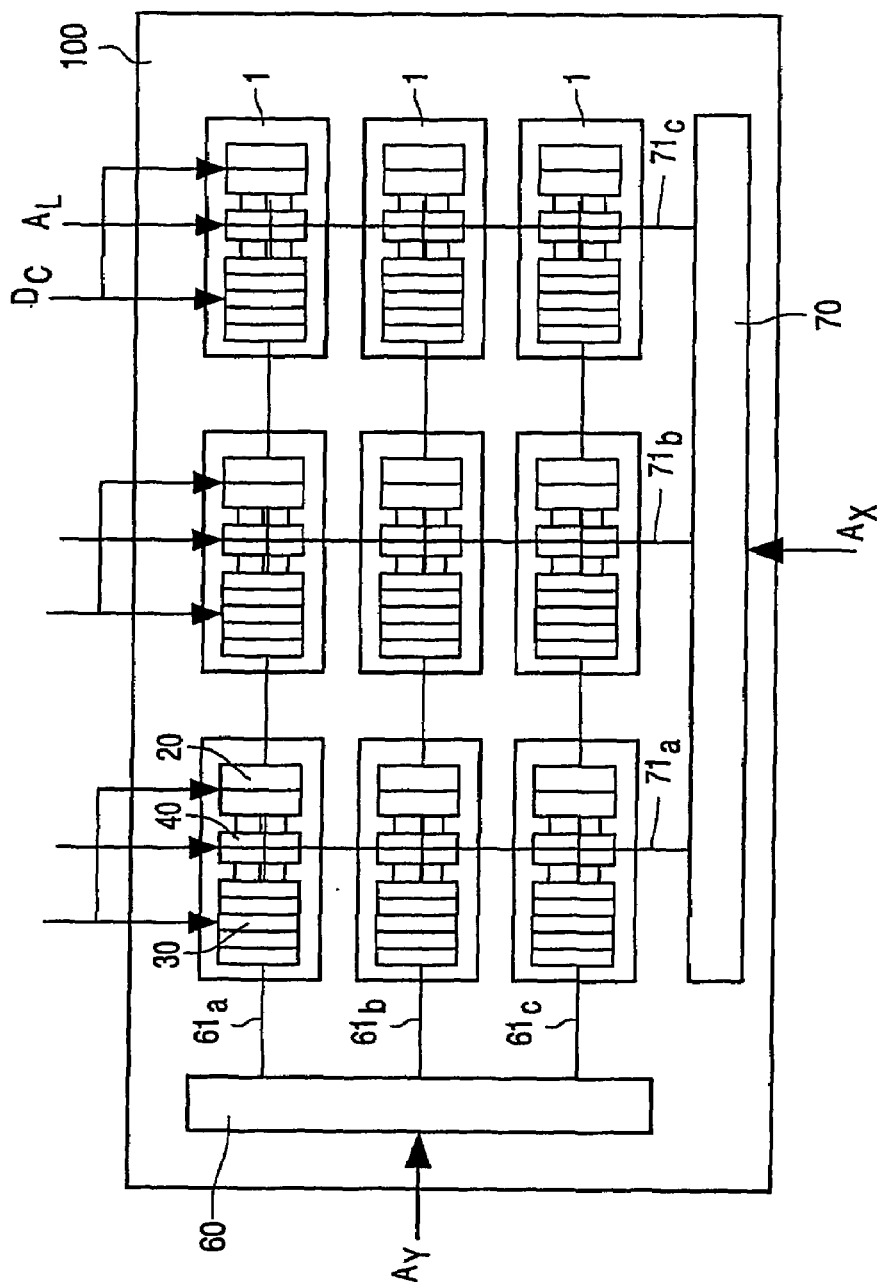
Figure 8A:
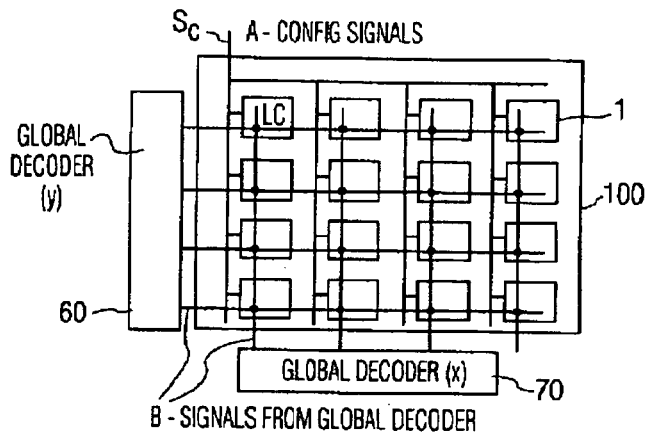
Figure 8B:
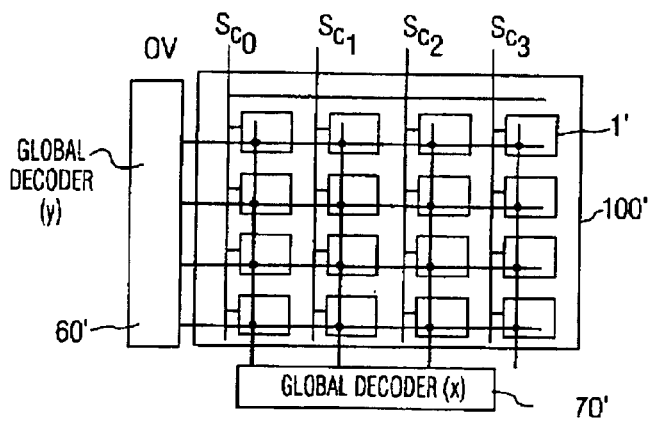
Figure 9:
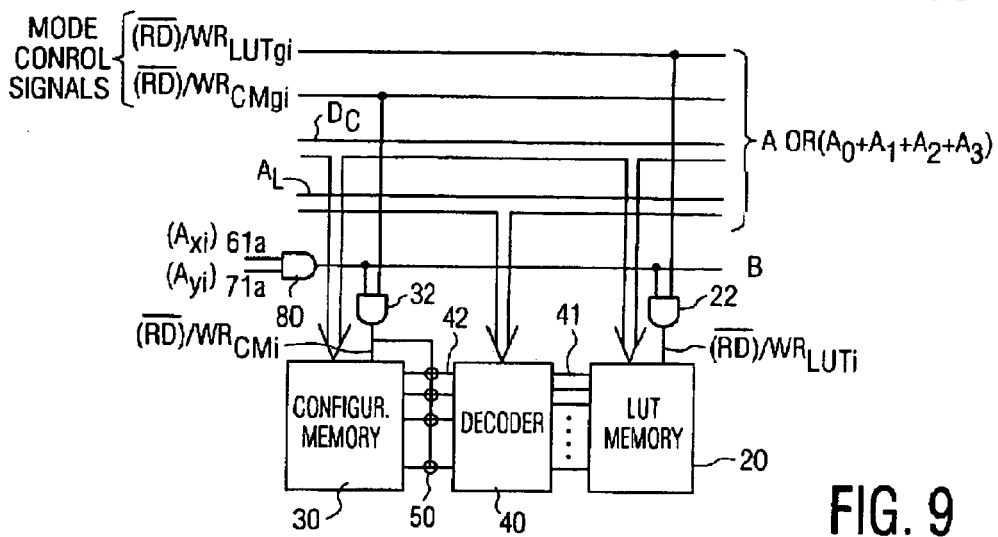
Figure 10:
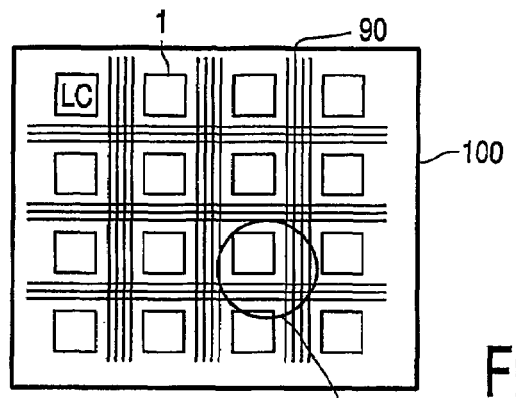
Figures 10A, 10B:
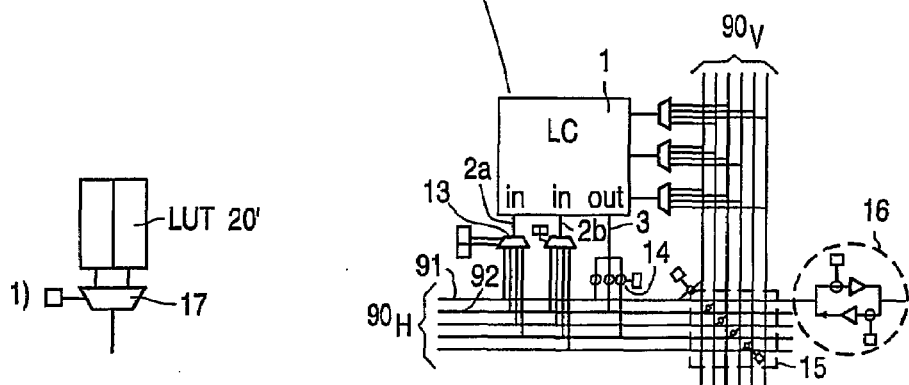
Figure 11:
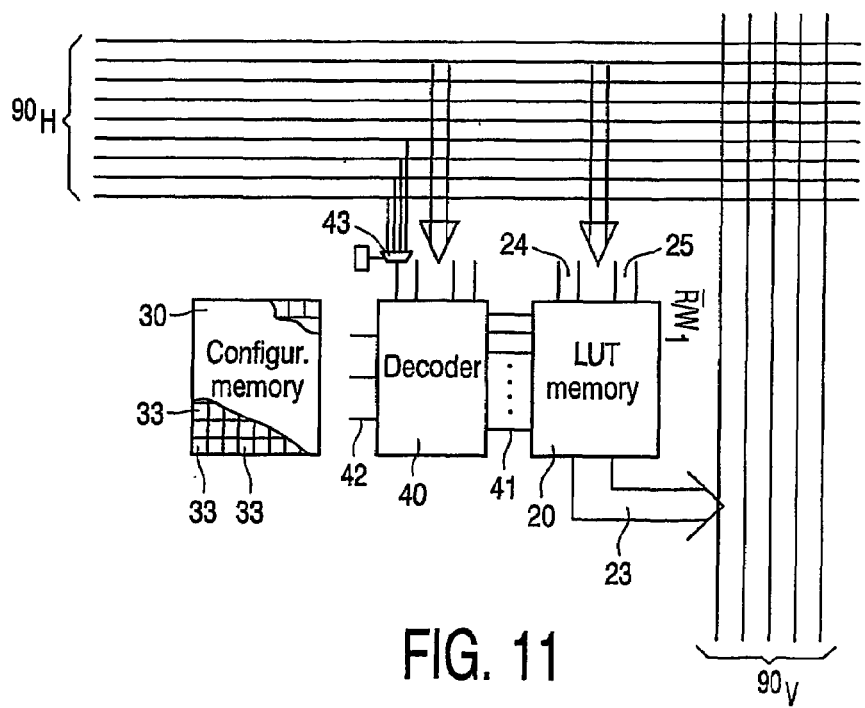

These and other aspects of the invention are described in more detail with reference to the drawing. Therein FIG. 1 shows a first type of conventional reconfigurable device, and a configuration memory cell in that device, FIG. 2 shows a second type of conventional reconfigurable device, and a configuration memory cell in that device, FIG. 3 shows a variant of the second type of reconfigurable device, FIG. 4 shows a third type of a conventional reconfigurable device, and a configuration memory cell in that device, FIG. 5A shows a conventional implementation of a lookup table, FIG. 5B shows a conventional implementation of a lookup table further having a memory functionality, FIG. 6 shows a first embodiment of a reconfigurable logic device according to the invention, FIG. 7 shows a second embodiment of a reconfigurable logic device according to the invention, FIG. 8 shows a reconfigurable processing device according to the invention, FIG. 8A shows a first embodiment of the reconfigurable processing device of FIG. 8, FIG. 8B shows a second embodiment of the reconfigurable processing device of FIG. 8, FIG. 9 shows an overview of the signals used for configuring reconfigurable processing unit according to the invention, FIGS. 10, 10A and 10B show some examples of the use of the output signals of the configuration memory units for controlling the dataflow, FIG. 11 shows in more detail a tile within a reconfigurable logic device and its connections, FIG. 12 shows in more detail the connections of the tile of FIG. 12, FIG. 13 shows a first application of the further memory in a reconfigurable device according to the invention, FIG. 14 shows a second application of the further memory in a reconfigurable device according to the invention.

In the sequel first some currently known related solutions are described in more detail. Subsequently a more detailed description of embodiments according to the invention are presented. The configuration memory architecture and its implementation are determined strongly by the programming method chosen for an arbitrary RL device. In today's RL devices three basic programming (configuration) methods can be identified. They are:
1. serial configuration,
2. parallel configuration,
3. serial-parallel configuration.

FIG. 1 schematically shows a reconfigurable device a, which is reconfigured with a serial configuration method. According to this method programming of an RL device is done serially. To realise that, configuration memory cells c of all tiles b of the device a are connected in a single long scan-chain. Data bits in such a scan-chain are shifted with subsequent clock pulses. Such an approach has the advantage that only two pins clock Cl and input data pins (data) are required to program an RL device. Advantageous is also that the architecture is easily testable. Disadvantages are however a long reconfiguration time (dependent on the number of configuration bits). A partial configuration is impossible, because a new value for a particular memory element in the chain has to be shifted through all preceding memory elements. A further disadvantage is that a large configuration memory cell c is required. This is in order to prevent that the current value of a memory cell can be overwritten before it is copied to the next memory cell in the chain during configuration mode. Because shifting of data in the flip-flop chain results in a bit toggling a serial RL device also requires a high configuration energy. For this reason the serial configuration technique is currently only used in RL devices with small configuration memories.

Figure 2:
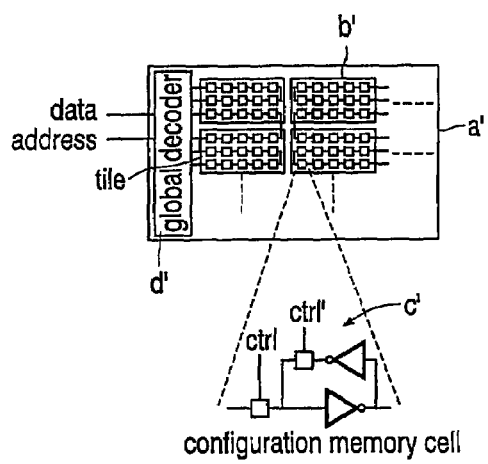

FIG. 2 shows a configuration memory of a device a' with tiles b' which is programmable in a parallel way. It has an architecture similar to traditional Random Access Memories (RAMs). Memory bits c' are organised in an array and the selection of a configuration bit/word to be programmed is done through a special global decoder d'. Thus, in contrast to the serial configuration method, programming of an RL device can be done selectively (i.e. without reconfiguring the whole device).

Such a device has the advantages that only small memory cells are required, and that a partial configuration of the device is possible.

Disadvantages are that the device requires a large global decoder d' for the selection of bits/words to be configured. Due to the use of long and heavily-loaded memory bit lines configuration energy is not negligible. Although the configuration memory has an architecture comparable to that of traditional RAM, its memory implementation is much less dense.

Parallel configurable RL devices are rarely used in a 'pure' form. The main problem is the very large number of data and address pins which are required to program a device. This is a problem especially for standalone devices in which the number of pins is limited by the package type.

A variant of the RL device shown in FIG. 2 is the device a" shown in FIG. 3, in which the tiles b" have a local decoder e". Such a local decoder e" is used to address configuration bits of the complete tile b". In this way, the complexity of the global decoder d" can be considerably reduced (only very few word lines are required). Another important advantage is a highly regular structure of the configuration memory architecture, which simplifies the implementation. The global decoder d" can have a relatively low complexity as compared to the global decoder d' of the device shown in FIG. 2. As the RL device of FIG. 2 it only requires small memory cells c" and allows a partial reconfiguration. A disadvantage is that each logic tile b" requires its own local decoder e".

FIG. 4 shows a further known architecture of a RL device a"", which is a combination of the architectures shown in FIG. 1 and FIG. 2. As in the parallel configurable device of FIG. 2 the configuration memory bits c"" are organised in an array. However, additional shift registers f"" and g"" are located at two sides of this array and are used to control the configuration procedure. As is shown in FIG. 4, the memory cells c"" of the tiles are relatively simple, while memory cells of the shift registers require a more complex Master-Slave memory cell (e.g. comparable to cell c of FIG. 1).

The vertical shift register is initialised with the top bit "on" and the remainder "off". This bit is shifted after programming of each row. The row selected by the vertical shift register is programmed in one clock cycle. It is done by copying the configuration bits which are stored at that time in the horizontal top shift register (see FIG. 4).

This configuration method can be easily modified either by changing the depth of the vertical and horizontal shift registers and/or by partitioning of the total configuration memory into separate blocks and implementing them as described above. The RL device shown in FIG. 4 is advantageous in that it has a highly regular and easily-modifiable architecture, small configuration memory cells, and in that it requires only a small number of configuration pins. It further allows for a partial configuration (only at the word-level) and requires only a low configuration energy. The configuration speed depends on the depth of the vertical shift register.

The present invention addresses primarily look-up table-based reconfigurable logic devices. A single look-up table (LUT) can implement an arbitrary logic function of k variables, where k is the number of the LUT inputs. Because of such flexibility, the LUT-based devices are currently the most commonly used. Today, the importance of the LUT-based RLdevices is even raised. One of the reasons is the possibility to configure a single LUT also as a small data memory.

According to the invention a common address decoder is used for addressing a first and a second memory unit, i.e. the LUT resources and the configuration memory units. This minimises the area overhead caused by the presence of the configuration memory in RL devices.

FIG. 5A shows a traditional implementation of a LUT in which a large multiplexer h is used to decode output bits ji of a set j of memory cells. If the same LUT is to be used also as a memory, an extra write decoder is required. In the embodiment of FIG. 5B this decoder is implemented as a demultiplexer k', which raises the total implementation cost of such a structure (see FIG. 5B).

FIG. 6 shows a first embodiment of a reconfigurable processing unit 1 in a reconfigurable logic device according to the invention. In that embodiment a common decoder 40 is shared between a first 30, and a second configuration memory 30'. The decoder 40 is addressed by address signals $A_1, \ldots, A_n$, and generates selection signals for the configuration memories 30, 30'. During configuration the configuration memories 30, 30' can either be loaded simultaneously, or after each other. In order to load a configuration memory 30 or 30' it is set into a write enable state by signal ctrl1 and ctrl2. The reconfigurable processing unit comprises data flow controlling elements 10 such as a multiplexer 11 and a gate 12. By way of example it is shown how the multiplexer 11 is controlled by the value stored in memory cell 31a, and the gate 12 is controlled by the value of cell 31b. It is further shown how further data flow controlling elements 10' comprising demultiplexer 11' and a gate 12' are controlled by the values stored in memory cells 31a' and 31b' of configuration memory 30'.

In the embodiment of the reconfigurable logic unit shown in FIG. 7 the LUT 20 serving as a data manipulating element is implemented in a way similar to the traditional RAM memories, i.e. it is controlled by a single decoder 40 (for a read and write operation) and comprises memory cells 21 which are organised in colum(s). In this way, one instead of two decoders is required. According to the invention the same decoder 40 which is used for addressing LUT memory 20 is reused to address the configuration memory 30. In the embodiments shown in FIGS. 6 and 7 the configuration memory bits 31 are grouped in columns and not distributed over the tile as in state-of-the-art implementations. This organization of the configuration memory 30 results in a highly dense layout and therewith further contributes to an efficient use of the available chip area. Moreover, a simpler memory cell can be used both for the LUT 20 and the configuration memory implementations 30.

Control signals ctrl1 and ctrl2 shown in FIG. 6 are the 'read/write' signals for the memories. The lookup table 20 comprises inputs coupled to the decoder 40 for controlling the memory cells 21 and inputs and outputs for writing and reading the LUT. Likewise the configuration memory 30 comprises inputs for loading the configuration and outputs for controlling the data flow controlling elements 10. By way of example it is assumed that a 4-input LUT (4-LUT) 20 is used. The 4-LUT requires a 4:16 decoder 40 to select the output bits. The same decoder 40 is used to address bits of the configuration memory 30 which configure the logic and routing resources of a tile. A decoder 40 for the 4-LUT requires four input signals A1, . . . A3. Furthermore the LUT 20 shown requires one input and one output for reading and writing, respectively. If the LUT has several outputs (so called multi-output LUT), respectively more inputs and outputs have to be added. The number of inputs for the configuration memory section depends on the total number N of configuration memory bits in a tile. Thus, a required number of memory columns M can be calculated as $$M = \frac{N}{2^k},$$

where $2^k$ is a number of memory cells in one column for a 4-LUT it is 16). Control signals associated with both memory sections determine their current modes, i.e. writing or reading.

To decrease the delay during the LUT read operation, the configuration memory 30, and thus the total load it represents, is separated from the decoder by a programmable switch 50, shown in more detail in FIG. 7B. This switch 50 is activated by a control signal Cs only when the configuration memory 30 is to be programmed. The dual-pass gate 51 is used as this does not introduce a threshold voltage drop (like single pass transistors), and the buffer 52 increases the driving strength. Examples of a configuration memory cell 31 and a logic (LUT) memory cell 21 are shown respectively in FIGS. 7A and 7C.

One of the very important advantages of the presented concept is its modularity and scalability. It means that the logic tiles with configuration memory implementation as described above, can be combined such that the configuration of the complete device can be easily implemented. To do so, one extra decoder (i.e. a global decoder) is required for the selection of the rows and columns of a RL device. The selected tile can be programmed in parallel using dedicated configuration pins. There is also a possibility to choose whether both or only one of the memories (i.e. LUT or configuration memory) are programmed at the same time. This option is obtained by providing separate read/write enable signals for either memory section. The configuration memory is controlled with $\overline{RD}/WR_{CMi}$, the LUTmemory is controlled with $\overline{RD}/WR_{LUTi}$ (see FIG. 7). The configuration memory is controlled with the local signal $\overline{RD}/WR_{CML}$, the LUT memory is controlled with the local signal $\overline{RD}/WR_{LUTL}$. These signals are generated by the logic gates 80, 32 and 22 from the selection signals $61_{i=a,b,c,\ldots}$, $71_{j=a, b, c, \ldots}$ and the global read/write control signals $\overline{RD}/WR_{CMg}$ and $\overline{RD}/WR_{LUTg}$. The index i and j of the selection signals indentify the column and the row, respectively, in which the logic tiles are arranged. In one embodiment the global read/write control signals $\overline{RD}/WR_{CMg}$ is shared among configuration memories of all logic tiles, and $\overline{RD}/WR_{LUTg}$ is shared among LUT memories of all logic tiles. In another embodiment, both global control signals can be shared among configuration and LUT memories of logic tiles in successive columns of a device ($\overline{RD}/WR_{CMgi}$ and $\overline{RD}/WR_{LUTgi}$). In yet another embodiment, both global control signals can be shared among configuration and LUT memories of logic tiles in successive rows of a device ($\overline{RD}/WR_{CMgi}$ and $\overline{RD}/WR_{LUTgi}$).

From the testability point of view the inventive design is again very beneficial. This is mainly due to the fact that each configuration memory bit may be accessed independently, so the user can quickly check the state of the programmable switches at any place of the device.

FIG. 8 presents the top-level view of a reconfigurable processing device 100 comprising a plurality of reconfigurable processing units 1 as shown in FIG. 7. Schematically the configuration memory 30, the local decoder 40 and the LUT memory 20 are show in the tiles. The reconfigurable processing device 100 further comprises a first 60 and a second global decoder 70 respectively for selecting the row and the column value of a reconfigurable processing unit 1. Each row of reconfigurable processing units 1 is coupled to an global row addres line 61a, 61b, 61c, and each column of these units is coupled to a global column line 71a, 71b, 71c. The first 60 and the second global decoder 70 are respectively coupled to global address buses $A_Y$ and $A_X$. The first global decoder 60 generates the signals at global row address lines 61a, 61b, 61c in response to the signals received at global address bus $A_Y$. The second global decoder 70 generates the signals at global column address lines 71a, 71b, 71c in response to the signals received at global address bus $A_X$ The reconfigurable processing units 1 are further coupled to a configuration data bus $D_C$ and to a local address bus $A_L$ and to control busses, for controlling reading and writing (not shown).

FIGS. 8A and 8B schematically shows two embodiments of the implementation shown in FIG. 8. In FIG. 8A the tiles 1 of the reconfigurable processing device 100 are each coupled to a common configuration bus $S_C$. This reduces the number of connections, but has the disadvantage that the load on the common configuration bus $S_C$ is relatively high. FIG. 8B shows an alternative embodiment of the reconfigurable processing device 100' wherein each column of tiles 1' is coupled to its own configuration bus $S_{C1}$, $S_{C2}$, $S_{C3}$, $S_{C4}$. This embodiment is particularly suitable for a device having a high number of I/O-pins or for embedded RL cores which are not primitive.

FIG. 9 shows the connections to the memory units in a tile, in particular those used during the reconfiguration mode, in some more detail. As is shown, addres inputs of the decoder 40 are connected to a first local address bus $A_L$. The decoder 40 has first outputs 41 which are coupled to the LUT memory 20. During a first configuration mode data is loaded from a configuration data bus Dc to the memory elements of the LUT memory 20 selected by said first outputs 41. The decoder 40 has second outputs 42 which are coupled to the configuration memory 30 via switches 50. During a second configuration mode data is loaded from the configuration data bus $D_C$ to the memory elements of the configuration memory 30 selected by said second outputs 42. During the first configuration mode the mode control signal $\overline{RD}/WR_{LUTg}$ (or $\overline{RD}/WR_{LUTgi}$ if the RL device has separate read/write control signals for LUTs in all columns of the device, or $\overline{RD}/WR_{LUTgi}$ if the RL device has separate read/write control signals for LUTs in all rows of the device) is set at a logically high value. A particular LUT 20 is set in a write enable mode if in addition the selection signalB is set at a high value. The selection signal B is generated by a combination element 80 from the value at the global row addres line, e.g. 61a, and the global column addres line, e.g. 71a which correspond to the particular reconfigurable processing unit 1. During the second configuration mode the mode control signal $\overline{RD}/WR_{CMg}$ (or $\overline{RD}/WR_{CMgi}$ if the RL dedevice has separate read/write control signals for all configuration memories in all columns of the device, or $\overline{RD}/WR_{LUTgi}$ if the RL device has separate read/write control signals for the configuration memories in all rows of the device) is set at a logically high value. A particular configuration memory unit i is set in a write enable mode if in addition the selection signal B is set at a high value. In that case the local control signal $\overline{RD}/WR_{CMi}$ assumes a logic value "1". Likewise, the LUT-memory 20 is in a write enable mode if the mode control signal $\overline{RD}/WR_{LUTgi}$ is "1" and in addition the selection signal B is generated by the combination element 80 from the value at the global row addres line, e.g. signal 61a, and the global column addres line, e.g. signal 71a which correspond to the particular reconfigurable processing unit 1. In that case the local control signal $\overline{RD}/WR_{LUTi}$ assumes a value "1".

Note that instead of loading the configuration memory 30 and the lookup table memory 20 in separate phases of the configuration mode, these memories could also be loaded simultaneously, provided that the configuration data bus is wide enough and that the reconfigurable device comprises a sufficient number of connection pins.

FIG. 10 schematically shows a reconfigurable device 100 having a plurality of files 1 and a communication network 90 comprising "vertical lines"$90_V$ and horizontal lines $90_H$ between the tiles. FIG. 10A shows several ways for reconfigurably connecting the tiles 1 to the communication network 90. The tile 1 shown in FIG. 10A has first inputs 2a, 2b which are connected to signal lines 91, 92 of the communication network 90. A signal line 91 may be controllably connected to an input 2a via a multiplexer 13, which is controlled by a first control signal having a value stored in a first memory cell of the configuration memory.

Outputs 3 of the tile 1 are controllably coupled by output switches 14 to the signal lines 90. The output switches 14 are controlled by second control signals having respective values stored in a second group of memory cells of the configuration memory.

'Vertical' and 'horizontal' signal lines $90_V$, $90_H$ of the communication network may be controllably coupled to each other via a switch box 15. The switch box 15 is controlled by third control signals having respective values stored in a third group of memory cells of the configuration memory.

In the embodiment shown in FIG. 10A the device further has controllable buffers 16 for connecting signal lines of the communication network to a global network. The buffers 16 are controlled by control signals having a value determined by a fourth group of memory cells in the configuration memory.

The configuration memory may not only control routing of signals between the tiles, but also for routing signal within a tile, as is shown in FIG. 10B. FIG. 10B shows a two output lookup table 20'. One of the outputs of the LUT 20' is selected to be coupled to a single output by a multiplexer 17, the multiplexer receiving a selection signal having a value determined by a fifth memory cell in the configuration memory.

FIG. 11 schematically shows a signal flow in a device according to the invention in the operational mode. In that mode the second outputs 42 of the decoder 40 are decoupled from the selection inputs of the configuration memory 30, and the configuration memory 30 is permanently kept in a read enable state. The data outputs 33 of the configuration memory 30 are coupled to the control inputs of the data flow controlling elements, e.g. an input multiplexer 43 for selecting the address signals for the decoder 40 from the 'horizontal' signal lines $90_H$. The decoded address offered to the LUT memory 20 at the outputs 41 results in one or more output values at memory outputs 23 transmitted to the vertical bus $90_V$. On the other hand the LUT memory 20 could also be used as a data memory in another configuration. In such a configuration data may be written from the vertical bus $90_V$ or the horizontal bus $90_H$ to the memory via secondary data inputs 24, 25.

The communication of the memory units with the communication network is shown in some more detail in FIGS. 12, 12A, 12B, 12C.

In FIG. 12 the address inputs A1, ..., A3 of the decoder 40 are coupled to a first multiplexer 43 which is controlled by the selection signal B. This first multiplexer 43 selects the adres input e.g. A3 of the decoder 40 either from a local address bus $A_L$ or from a second multiplexer 44 which is coupled to the communication network 90, and which is controlled by the configuration memory 30. The lookup table 20 adressed by the decoder 40 has a first data input which is coupled to a third multiplexer 26 which selects either a signal from the configuration data bus $D_C$, or a signal from a fourth multiplexer 28 which is coupled to the communication network 90. The third multiplexer 26 is controlled by the local signal $\overline{RD}/WR_{LUTi}$. The fourth multiplexer 28 is controlled by the configuration memory 30. A fifth multiplexer 27 selects the write enable signal for the LUT 20 from the signal $\overline{RD}/WR_{LUTgi}$ (or $\overline{RD}/WR_{LUTgi}$ or $\overline{RD}/WR_{LUTg}$) and the output of a sixth multiplexer 29 which is coupled to the communication network 90. The fifth multiplexer 27 is also controlled by the local signal $\overline{RD}/WR_{LUTi}$. The sixth multiplexer 29 (See also FIG. 12A) is controlled by the configuration memory 30. During the first configuration mode the third multiplexer 26 selects the signal from the configuration data bus $D_C$ and the write enable signal is controlled by the signal $\overline{RD}/WR_{LUTgi}$ so that the LUT 20 can be loaded with LUT data. During the operational mode, when the data input and the read write control signal of the LUT 20 are coupled to the communication network 90, the LUT can be used as a LUT is it is kept in a read enable mode. Alternatively the memory unit 20 can be used as a RAM device, in that data from the communication network 90 can be routed via the multiplexers 28 and 26 the memory unit 20 and can be stored in locations of the memory unit 20 selected by the decoder 40.

FIG. 12B shows the organization of the reconfigurable device 100 in a configuration plane 100A, comprising the configuration memory 30 and configuration control $\overline{RD}/WR_{LUTgi}$, $\overline{RD}/WR_{CMgi}$, $A_L$ and data lines $D_C$ and a routing plane 100B, which comprises the data flow controlling elements and a routing network $90_H$, $90_V$.

FIG. 12C shows in more detail the connection of the outputs 23 of the LUT 20 via controllable switches 14 to (e.g. the horizontal bus $90_H$ of) the communication network 90.

The memory unit 20 can for example be configured as a logic element. This is shown in FIG. 13, wherein the memory unit 20 functions (right half) as a 4-input AND-gate (left half of the figure). In this case the memory unit 20 is loaded with loaded with LUT-data representing the logical function of the logical element during the configuration mode, and kept read enable during the operational mode of the device.

Otherwise the memory unit 20 (shown on the right half of the Figure) can be implemented as an SRAM (left half), as is shown in FIG. 14. This requires that the memory unit 20 has one or more data inputs 24 coupled to the communication network. Furthermore the $\overline{R}/W$ control line should be dynamically controllable during operational mode.

It is remarked that the scope of protection of the invention is not restricted to the embodiments described herein. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general purpose processor. The invention resides in each new feature or combination of features.

The invention claimed is:

1. Reconfigurable processing unit (1) comprising:
data flow controlling elements (10);
data manipulating elements (20);
a configuration memory unit (30) comprising a plurality of memory cells (31a, ...) for storing settings of the data flow controlling elements (10); and
an address decoder (40) for converting an address into selection signals for the memory cells (31a, ...);
characterized in that the address decoder (40) is shared between the configuration memory unit (30) and a further memory unit (20); and
characterized in that the further memory unit (20) and the address decoder (40) form a lookup table, the lookup table being used as a data manipulating element.

2. Reconfigurable processing unit according to claim 1, characterized in that the further memory unit is configurable as a data storage element, for storing data values being generated as a result of the data flow.

3. Reconfigurable processing unit according to claim 1, characterized in that the configuration memory unit is addressed by the common address decoder via a programmable switch (50).

4. Reconfigurable processing device (100) according to claim 1, comprising a plurality of reconfigurable processing units (1) according to one of the previous claims, characterized by one or more global address decoders (60, 70), for selectively giving the processing units access to a configuration bus ($S_C$).

* * * * *